(12) United States Patent
Zhu et al.

(10) Patent No.: US 12,713,753 B2
(45) Date of Patent: Aug. 18, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Ping Zhu, Wuhan (CN); Weilai Liu, Wuhan (CN); Liang Sun, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 449 days.

(21) Appl. No.: 18/564,476

(22) PCT Filed: Aug. 18, 2023

(86) PCT No.: PCT/CN2023/113822
§ 371 (c)(1),
(2) Date: Nov. 27, 2023

(87) PCT Pub. No.: WO2025/025278
PCT Pub. Date: Feb. 6, 2025

(65) Prior Publication Data

US 2025/0048821 A1 Feb. 6, 2025

(30) Foreign Application Priority Data

Jul. 31, 2023 (CN) ......................... 202310954481.9

(51) Int. Cl.
*H10H 29/10* (2025.01)
*H10H 20/856* (2025.01)

(52) U.S. Cl.
CPC .......... *H10H 29/10* (2025.01); *H10H 20/856* (2025.01)

(58) Field of Classification Search
CPC ...... H10H 29/10; H10H 20/856; H10H 29/14; H10H 29/8321; H10H 29/857; H10H 29/962
See application file for complete search history.

(56) References Cited

U.S. PATENT DOCUMENTS

2025/0151476 A1* 5/2025 Wang .................. H10H 29/012

* cited by examiner

*Primary Examiner* — Thanh Y. Tran
(74) *Attorney, Agent, or Firm* — The Roy Gross Law Firm, LLC; Roy D. Gross

(57) ABSTRACT

The present disclosure provides a display panel and a display device. The display panel includes a driving substrate, a pixel unit group, a bottom bonding layer, and at least one interlayer bonding layer. The pixel unit group is disposed on a side of the driving substrate. The pixel unit group includes a plurality of pixel units that are stacked. The pixel unit that is in the pixel unit group and is close to the driving substrate is bonded to the driving substrate through the bottom bonding layer. Adjacent two of the pixel units are bonded to each other through the interlayer bonding layer.

20 Claims, 2 Drawing Sheets

DISPLAY PANEL AND DISPLAY DEVICE

CROSS REFERENCE TO RELATED APPLICATIONS

This application claims the priority of International Application No. PCT/CN2023/113822, filed on Aug. 18, 2023, which claims the priority to Chinese Patent Application No. 202310954481.9, filed on Jul. 31, 2023. The entire disclosures of the above applications are incorporated herein by reference.

FIELD OF INVENTION

The present disclosure relates to the field of display technologies, and in particular, to a display panel and a display device.

BACKGROUND OF INVENTION

With the development of display technologies, there are increasingly higher requirements for colors and portability. Light-emitting diodes (LED) made of semiconductor materials have excellent optical efficiency, and are gradually entering the markets of consumer electronics such as mobile devices and televisions.

LEDs made of semiconductor materials may be applied to color micro display technologies. At least three monochromatic independent screen bodies, that is, a red micro LED structure, a green micro LED structure, and a blue micro LED structure, are usually used. The three micro LED structures form one color image through an optical mechanism. However, in the foregoing method, an eventually formed light-emitting module has a large size, which severely affects the requirement of screen miniaturization for micro display. Apart from the foregoing method, quantum dots may be used as an optical conversion material to convert blue light into required pure green light and red light. However, heat formed in a light emission process of LEDs and an optical conversion process of quantum dots affects the stability of the quantum dots. Especially a quantum dot optical conversion layer has poor thermal conductivity in thick film layers, and thermal accumulation is formed, resulting in reduced stability and service life of the quantum dots.

SUMMARY OF INVENTION

Embodiments of the present disclosure provide a display panel and a display device, to mitigate deficiencies in the related art.

To achieve the foregoing functions, the technical solutions provide in the embodiments of the present disclosure are as follows:

Embodiments of the present disclosure provide a display panel, including:

a driving substrate;

a pixel unit group, disposed on a side of the driving substrate, wherein the pixel unit group includes a plurality of pixel units that are stacked, and each pixel unit includes a first functional layer, a light-emitting layer, and a second functional layer that are stacked;

a bottom bonding layer, wherein the pixel unit that is in the pixel unit group and is close to the driving substrate is bonded to the driving substrate through the bottom bonding layer; and at least one interlayer bonding layer, wherein adjacent two of the pixel units are bonded to each other through the interlayer bonding layer, wherein the first functional layers of adjacent two of the pixel units are adjacent, and each interlayer bonding layer is located between adjacent two of the first functional layers, or, second functional layers of adjacent two of the pixel units are adjacent, and each interlayer bonding layer is located between adjacent two of the second functional layers.

In the display panel provided in the present embodiment, a connection electrode is disposed at an edge of each interlayer bonding layer, and two of the first functional layers or two of the second functional layers adjacent to each interlayer bonding layer are electrically connected to the driving substrate by a same connection electrode.

In the display panel provided in the present embodiment, a boss is formed at the pixel unit group, and in a direction of the driving substrate pointing to the pixel unit group, in adjacent two of the pixel units, a width of the pixel unit disposed close to the driving substrate is greater than a width of the pixel unit disposed away from the driving substrate.

In the display panel provided in the present embodiment, the pixel unit group includes a first pixel unit and a second pixel unit, the second pixel unit is located on a side of the first pixel unit away from the driving substrate, the first pixel unit includes a first light-emitting layer, the second pixel unit includes a second light-emitting layer, and a light-emitting color of the first light-emitting layer is different from a light-emitting color of the second light-emitting layer; and the interlayer bonding layer includes a first interlayer bonding layer, the first interlayer bonding layer is located between the first pixel unit and the second pixel unit, the first interlayer bonding layer includes a first bonding main body portion and a first extension portion, and the first extension portion extends in a first direction from an end of the first bonding main body portion, wherein the first pixel unit and the second pixel unit are bonded to each other through the first bonding main body portion, an orthogonal projection of the first extension portion onto the driving substrate is located in an orthogonal projection of the first pixel unit onto the driving substrate, and the orthogonal projection of the first extension portion onto the driving substrate and an orthogonal projection of the second pixel unit onto the driving substrate do not overlap.

In the display panel provided in the present embodiment, the pixel unit group further includes a third pixel unit, the third pixel unit is located on a side of the second pixel unit away from the first pixel unit, the third pixel unit includes a third light-emitting layer, and the light-emitting color of the first light-emitting layer, the light-emitting color of the second light-emitting layer, and a light-emitting color of the third light-emitting layer are different; and the interlayer bonding layer includes a second interlayer bonding layer, the second interlayer bonding layer includes a second bonding main body portion and a second extension portion, and the second extension portion extends in a second direction from an end of the second bonding main body portion, wherein the second pixel unit and the third pixel unit are bonded to each other through the second bonding main body portion, an orthogonal projection of the second extension portion onto the driving substrate is located in the orthogonal projection of the second pixel unit onto the driving substrate, and the orthogonal projection of the second extension portion onto the driving substrate and an orthogonal projection of the third pixel unit onto the driving substrate do not overlap.

In the display panel provided in the present embodiment, the boss includes a first side wall and a second side wall that are disposed oppositely, the first side wall is located on a side of the first extension portion away from the first bonding main body portion, and the second side wall is located on a side of the second extension portion away from the second bonding main body portion; and the connection electrode includes a first connection electrode and a second connection electrode, the first connection electrode is located on the first side wall of the boss, the first connection electrode and the first side wall are disposed insulatively from each other, the second connection electrode is located on the second side wall of the boss, and the second connection electrode and the second side wall are disposed insulatively from each other, wherein the bottom bonding layer is electrically connected to a first contact of the driving substrate; an end of the first connection electrode is connected to the first extension portion, and another end of the first connection electrode is electrically connected to a second contact of the driving substrate; and an end of the second connection electrode is connected to the second extension portion, and another end of the second connection electrode is electrically connected to a third contact of the driving substrate.

In the display panel provided in the present embodiment, the third pixel unit includes a top electrode, and the top electrode is located on a side of the third pixel unit away from the driving substrate;

the boss includes a third side wall connecting the first side wall and the second side wall; and the connection electrode includes a third connection electrode, the third connection electrode is located on the third side wall of the boss, and the third connection electrode and the third side wall are disposed insulatively from each other, wherein an end of the third connection electrode is connected to the top electrode of the third pixel unit, and another end of the third connection electrode is electrically connected to a fourth contact of the driving substrate.

In the display panel provided in the present embodiment, orthogonal projections of the first contact, the second contact, the third contact, and the fourth contact onto the driving substrate do not overlap.

In the display panel provided in the present embodiment, the display panel further includes a first reflection layer, a second reflection layer, and a third reflection layer, the first reflection layer is located between the first light-emitting layer and the bottom bonding layer, the second reflection layer is located between the second light-emitting layer and the first interlayer bonding layer, and the third reflection layer is located between the third light-emitting layer and the second interlayer bonding layer.

In the display panel provided in the present embodiment, the first reflection layer is configured to reflect light having a first wavelength, the second reflection layer is configured to reflect light having a second wavelength, and the third reflection layer is configured to reflect light having a third wavelength, wherein the light having the first wavelength includes light emitted by the first light-emitting layer, the light having the second wavelength includes light emitted by the second light-emitting layer, and the light having the third wavelength includes light emitted by the third light-emitting layer.

In the display panel provided in the present embodiment, a material of the bottom bonding layer is a reflective conductive material; and/or a material of the interlayer bonding layer is a transparent conductive material.

In the display panel provided in the present embodiment, the first functional layer is one of a p-type doped layer and an n-type doped layer, and the second functional layer is the other one of the p-type doped layer and the n-type doped layer.

An embodiment of the present disclosure provides a display panel. The display device includes a terminal main body and a display panel, the terminal main body and the display panel are integrated, and the display panel includes:

a driving substrate;

a pixel unit group, disposed on a side of the driving substrate, wherein the pixel unit group includes a plurality of pixel units that are stacked, and each pixel unit includes a first functional layer, a light-emitting layer, and a second functional layer that are stacked;

a bottom bonding layer, wherein the pixel unit that is in the pixel unit group and is close to the driving substrate is bonded to the driving substrate through the bottom bonding layer; and at least one interlayer bonding layer, wherein adjacent two of the pixel units are bonded to each other through the interlayer bonding layer, wherein the first functional layers of adjacent two of the pixel units are adjacent, and each interlayer bonding layer is located between adjacent two of the first functional layers, or, second functional layers of adjacent two of the pixel units are adjacent, and each interlayer bonding layer is located between adjacent two of the second functional layers.

In the display device provided in the present embodiment, a connection electrode is disposed at an edge of each interlayer bonding layer, and two of the first functional layers or two of the second functional layers adjacent to each interlayer bonding layer are electrically connected to the driving substrate by a same connection electrode.

In the display device provided in the present embodiment, a boss is formed at the pixel unit group, and in a direction of the driving substrate pointing to the pixel unit group, in adjacent two of the pixel units, a width of the pixel unit disposed close to the driving substrate is greater than a width of the pixel unit disposed away from the driving substrate.

In the display device provided in the present embodiment, the pixel unit group includes a first pixel unit and a second pixel unit, the second pixel unit is located on a side of the first pixel unit away from the driving substrate, the first pixel unit includes a first light-emitting layer, the second pixel unit includes a second light-emitting layer, and a light-emitting color of the first light-emitting layer is different from a light-emitting color of the second light-emitting layer; and the interlayer bonding layer includes a first interlayer bonding layer, the first interlayer bonding layer is located between the first pixel unit and the second pixel unit, the first interlayer bonding layer includes a first bonding main body portion and a first extension portion, and the first extension portion extends in a first direction from an end of the first bonding main body portion, wherein the first pixel unit and the second pixel unit are bonded to each other through the first bonding main body portion, an orthogonal projection of the first extension portion onto the driving substrate is located in an orthogonal projection of the first pixel unit onto the driving substrate, and the orthogonal projection of the first extension portion onto the driving substrate and an orthogonal projection of the second pixel unit onto the driving substrate do not overlap.

In the display device provided in the present embodiment, the pixel unit group further includes a third pixel unit, the third pixel unit is located on a side of the second pixel unit away from the first pixel unit, the third pixel unit includes a third light-emitting layer, and the light-emitting color of the first light-emitting layer, the light-emitting color of the second light-emitting layer, and a light-emitting color of the third light-emitting layer are different; and the interlayer bonding layer includes a second interlayer bonding layer, the second interlayer bonding layer includes a second bonding main body portion and a second extension portion, and the second extension portion extends in a second direction from an end of the second bonding main body portion, wherein the second pixel unit and the third pixel unit are bonded to each other through the second bonding main body portion, an orthogonal projection of the second extension portion onto the driving substrate is located in the orthogonal projection of the second pixel unit onto the driving substrate, and the orthogonal projection of the second extension portion onto the driving substrate and an orthogonal projection of the third pixel unit onto the driving substrate do not overlap.

In the display device provided in the present embodiment, the boss includes a first side wall and a second side wall that are disposed oppositely, the first side wall is located on a side of the first extension portion away from the first bonding main body portion, and the second side wall is located on a side of the second extension portion away from the second bonding main body portion; and the connection electrode includes a first connection electrode and a second connection electrode, the first connection electrode is located on the first side wall of the boss, the first connection electrode and the first side wall are disposed insulatively from each other, the second connection electrode is located on the second side wall of the boss, and the second connection electrode and the second side wall are disposed insulatively from each other, wherein the bottom bonding layer is electrically connected to a first contact of the driving substrate; an end of the first connection electrode is connected to the first extension portion, and another end of the first connection electrode is electrically connected to a second contact of the driving substrate; and an end of the second connection electrode is connected to the second extension portion, and another end of the second connection electrode is electrically connected to a third contact of the driving substrate.

In the display device provided in the present embodiment, the third pixel unit includes a top electrode, and the top electrode is located on a side of the third pixel unit away from the driving substrate;

the boss includes a third side wall connecting the first side wall and the second side wall; and the connection electrode includes a third connection electrode, the third connection electrode is located on the third side wall of the boss, and the third connection electrode and the third side wall are disposed insulatively from each other, wherein an end of the third connection electrode is connected to the top electrode of the third pixel unit, and another end of the third connection electrode is electrically connected to a fourth contact of the driving substrate.

In the display device provided in the present embodiment, orthogonal projections of the first contact, the second contact, the third contact, and the fourth contact onto the driving substrate do not overlap.

Beneficial Effects

The embodiments of the present disclosure provide a display panel and a display device. The display panel includes a driving substrate, a pixel unit group, a bottom bonding layer, and at least one interlayer bonding layer. The pixel unit that is in the pixel unit group and is close to the driving substrate is bonded to the driving substrate through the bottom bonding layer. Adjacent two of the pixel units are bonded to each other through the interlayer bonding layer. The first functional layers of adjacent two of the pixel units are adjacent, and each interlayer bonding layer is located between adjacent two of the first functional layers, or, second functional layers of adjacent two of the pixel units are adjacent, and each interlayer bonding layer is located between adjacent two of the second functional layers. In this way, a design in which adjacent two of the pixel units are jointly connected to a same connection electrode can be implemented, and the design of the connection electrode in the related art is reduced, to prevent the design of excessive connection electrodes from occupying a light-emitting area of a light-emitting layer in the pixel unit, so that a light-emitting area of the pixel unit group can be increased and light-emitting efficiency can be improved.

BRIEF DESCRIPTION OF DRAWINGS

The specific implementations of the present disclosure are described below in detail with reference to the accompanying drawings, which will make the technical solutions and other beneficial effects of the present disclosure obvious.

DETAILED DESCRIPTION OF PREFERRED EMBODIMENTS

The following clearly and completely describes the technical solutions in the embodiments of the present disclosure with reference to the accompanying drawings in the embodiments of the present disclosure. Apparently, the described embodiments are only some of the embodiments of the present disclosure rather than all of the embodiments. All other embodiments obtained by a person skilled in the art based on embodiments of the present disclosure without creative efforts shall fall within the protection scope of the present disclosure.

Embodiments of the present disclosure provide a display panel and a display device. Detailed descriptions are separately provided below. It should be noted that an order described in the following embodiments are not used to limit a preferred order of the embodiments.

Figures 1, 2:
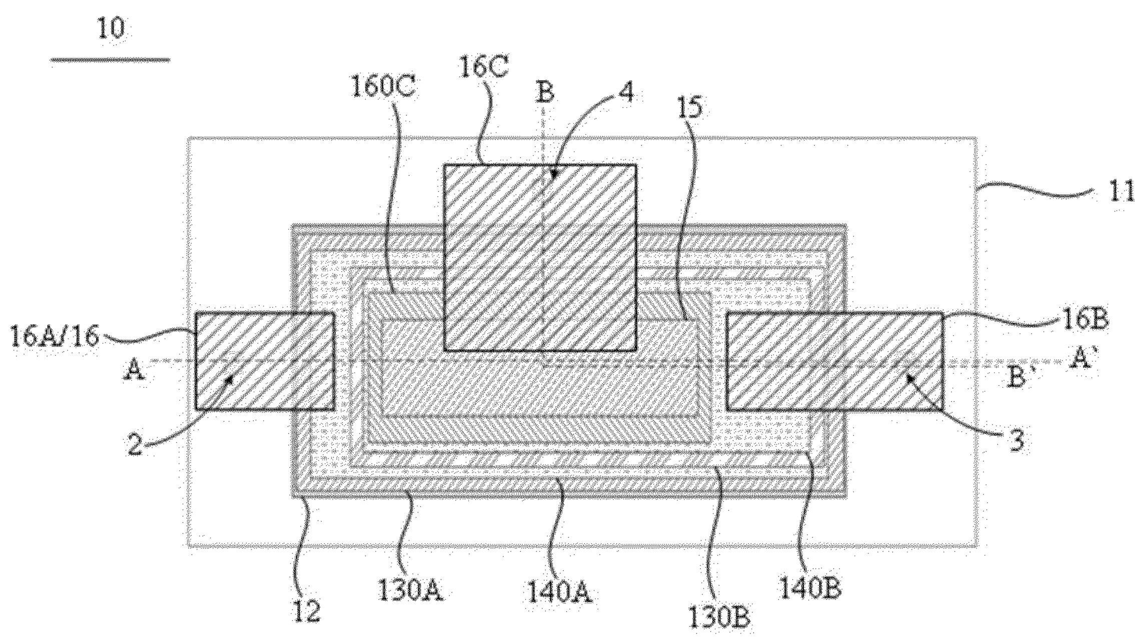
FIG. 1 is a top view of a display panel according to an embodiment of the present disclosure.
FIG. 2 is a cross-sectional view along A-A' in FIG. 1.
Figure 3:
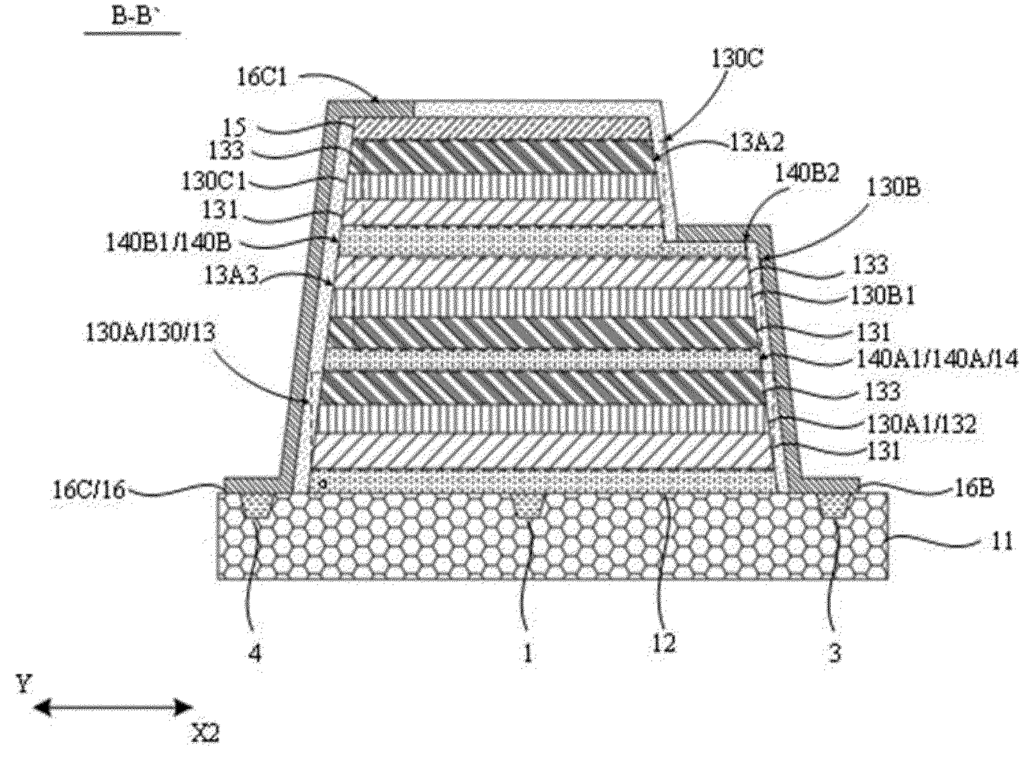
FIG. 3 is a cross-sectional view along B-B' in FIG. 1.

Referring to FIGS. 1 to 3, the present embodiment provides a display panel and a display device. A display panel 10 includes a driving substrate 11, a pixel unit group 13, a bottom bonding layer 12, and at least one interlayer bonding layer 14. The pixel unit group 13 is disposed on a side of the driving substrate 11. The pixel unit group 13 includes a plurality of pixel units that are stacked 130. Each pixel unit 130 includes a first functional layer 131, a light-emitting layer 132, and a second functional layer 133 that are stacked. A pixel unit 130 that is in the pixel unit group 13 and is close to the driving substrate 11 is bonded to the driving substrate 11 through the bottom bonding layer 12. Adjacent two of the pixel units 130 are bonded to each other through the interlayer bonding layer 14.

The first functional layers 131 of adjacent two of the pixel units 130 are adjacent, and each interlayer bonding layer 14 is located between adjacent two of the first functional layers 131, or, second functional layers 133 of adjacent two of the pixel units 130 are adjacent, and each interlayer bonding layer 14 is located between adjacent two of the second functional layers 133.

It should be noted that, at present, LEDs made of semiconductor materials may be applied to color micro display technologies. At least three monochromatic independent screen bodies, that is, a red micro LED structure, a green micro LED structure, and a blue micro LED structure, are usually used. The three micro LED structures form one color image through an optical mechanism. However, in the foregoing method, an eventually formed light-emitting module has a large size, which severely affects the requirement of screen miniaturization for micro display. Apart from the foregoing method, quantum dots may be used as an optical conversion material to convert blue light into required pure green light and red light. However, heat formed in a light emission process of LEDs and an optical conversion process of quantum dots affects the stability of the quantum dots. Especially a quantum dot optical conversion layer has poor thermal conductivity in thick film layers, and thermal accumulation is formed, resulting in reduced stability and service life of the quantum dots.

In the present embodiment, the pixel unit group includes a plurality of pixel units that are stacked. The pixel unit that is in the pixel unit group and is close to the driving substrate is bonded to the driving substrate through the bottom bonding layer. Adjacent two of the pixel units are bonded to each other through the interlayer bonding layer. In this way, a display panel having a vertical pixel unit group is formed, so that a color light source with a specific area and uniform luminance can be formed in a narrow size, and the size of the display panel can be effectively reduced. In addition, the first functional layers of adjacent two of the pixel units are adjacent, and each interlayer bonding layer is located between adjacent two of the first functional layers, or, second functional layers of adjacent two of the pixel units are adjacent, and each interlayer bonding layer is located between adjacent two of the second functional layers. In this way, a design in which adjacent two of the pixel units are jointly connected to a same connection electrode can be implemented, and the design of the connection electrode in the related art is reduced, to prevent the design of excessive connection electrodes from occupying a light-emitting area of a light-emitting layer in the pixel unit, so that a light-emitting area of the pixel unit group can be increased and light-emitting efficiency can be improved.

In the present embodiment, refer to FIGS. 1, 2, and 3. FIG. 1 is a top view of a display panel according to an embodiment of the present disclosure. FIG. 2 is a cross-sectional view along A-A' in FIG. 1. FIG. 3 is a cross-sectional view along B-B' in FIG. 1.

In the present embodiment, the driving substrate 11 includes a driving circuit (not shown in the figure). The driving circuit includes a pixel driver. The pixel driver includes, but not limited to, one of a thin-film transistor pixel driver or a silicon CMOS pixel driver. The pixel driver may control operation of the pixel unit 130.

In the present embodiment, a connection electrode 16 is disposed at an edge of each interlayer bonding layer 14, and two of the first functional layers 131 or two of the second functional layers 133 adjacent to each interlayer bonding layer 14 are electrically connected to the driving substrate 11 by a same connection electrode 16. In this way, a design in which adjacent two of the pixel units 130 are jointly connected to a same connection electrode 16 can be implemented.

Further, in the present embodiment, an orthogonal projection of the pixel unit group 13 onto the driving substrate 11 covers an orthogonal projection of the bottom bonding layer 12 onto the driving substrate 11. A boss 13A is formed at the pixel unit group 13, and in a direction of the driving substrate 11 pointing to the pixel unit group 13, in adjacent two of the pixel units 130, a width of the pixel unit 130 disposed close to the driving substrate 11 is greater than a width of the pixel unit 130 disposed away from the driving substrate 11. A cross-section of a side wall of the boss 13A in a direction perpendicular to the driving substrate 11 is a straight line. The boss 13A is an inverted taper or a cross-sectional shape of the boss 13A is a trapezoid. The inverted taper may be naturally formed upward from the bottom during etching and patterning of the layers in the pixel unit group 13. The inverted taper structure can improve electrical connection between adjacent two of the pixel units 130 and simplify a manufacturing process.

Specifically, the boss 13A includes an upper surface that connects two side walls and is away from the driving substrate 11 and a lower surface that connects the two side walls and is close to the driving substrate 11. A first preset angle $\alpha$ between each side wall and the lower surface of the boss 13A is greater than or equal to 45 degrees, and is less than 90 degrees. The first preset angle $\alpha$ is preferably one of 45 degrees, 60 degrees or 75 degrees, so that light-emitting efficiency of the pixel unit group 13 can be controlled by controlling the first preset angle $\alpha$.

Further, the pixel unit group 13 includes a first pixel unit 130A and a second pixel unit 130B that are stacked, the second pixel unit 130B is located on a side of the first pixel unit 130A away from the bottom bonding layer 12, the first pixel unit 130A includes a first light-emitting layer 130A1, the second pixel unit 130B includes a second light-emitting layer 130B1, and a light-emitting color of the second light-emitting layer 130B1 is different from a light-emitting color of the first light-emitting layer 130A1.

The interlayer bonding layer 14 includes a first interlayer bonding layer 140A. The first interlayer bonding layer 140A is located between the first pixel unit 130A and the second pixel unit 130B. The first functional layer 131 of the first pixel unit 130A is bonded to the driving substrate 11 through the bottom bonding layer 12. The second functional layer 133 of the first pixel unit 130A is bonded to the second functional layer 133 of the second pixel unit 130B through the first interlayer bonding layer 140A.

The first functional layer 131 is one of a p-type semiconductor layer and an n-type semiconductor layer. The second functional layer 133 is the other one of the p-type semiconductor layer and the n-type semiconductor layer. Preferably, in the present embodiment, the technical solution of the present disclosure is described by using an example in which the first functional layer 131 is the p-type semiconductor layer and the second functional layer 133 is the n-type semiconductor layer.

It should be noted that, in the prior art, an LED pixel unit includes a P-type semiconductor layer, a light-emitting layer, and an N-type semiconductor layer that are stacked. In each LED pixel unit, at least two connection electrodes need to be connected to a P electrode and an N electrode of the pixel driver. An increase in the density of connection electrodes causes increases in the parasitic resistance and capacitance of the LED pixel unit. A large amount of power is lost on leads, and chip efficiency is reduced. In addition, a large number of connection electrodes occupy a larger light-emitting region of the LED pixel unit, a proportion of a light-emitting area is limited, and a display resolution is restricted from increasing.

It may be understood that in the present embodiment, the second functional layer 133 of the first pixel unit 130A and the second functional layer 133 of the second pixel unit 130B are bonded together through the first interlayer bonding layer 140A. The second functional layer 133 of the first pixel unit 130A, the first interlayer bonding layer 140A, and the second functional layer 133 of the second pixel unit 130B are connected to each other to form a first common electrode. The first common electrode is electrically connected to the driving substrate 11 by one connection electrode 16, and the design of the connection electrode 16 in the related art is reduced, to prevent the design of excessive connection electrodes 16 from occupying a light-emitting area of a light-emitting layer in the pixel unit 130, so that a light-emitting area of the pixel unit group 13 can be increased and light-emitting efficiency can be improved.

Further, in the present embodiment, the first interlayer bonding layer 140A includes a first bonding main body portion 140A1 and a first extension portion 140A2, and the first extension portion 140A2 extends in a first direction X1 from an end of the first bonding main body portion 140A1. The first pixel unit 130A and the second pixel unit 130B are bonded to each other through the first bonding main body portion 140A1, an orthogonal projection of the first extension portion 140A2 onto the driving substrate 11 is located in an orthogonal projection of the first pixel unit 130A onto the driving substrate 11, and the orthogonal projection of the first extension portion 140A2 onto the driving substrate 11 and an orthogonal projection of the second pixel unit 130B onto the driving substrate 11 do not overlap, to ensure an effective light-emitting area of the second pixel unit 130B.

In the present embodiment, referring to FIGS. 1, 2, and 3, the pixel unit group 13 further includes a third pixel unit 130C, the third pixel unit 130C is located on a side of the second pixel unit 130B away from the first pixel unit 130A, the third pixel unit 130C includes a third light-emitting layer 130C1, and the light-emitting color of the first light-emitting layer 130A1, the light-emitting color of the second light-emitting layer 130B1, and a light-emitting color of the third light-emitting layer 130C1 are different.

The interlayer bonding layer 14 includes a second interlayer bonding layer 140B. The second interlayer bonding layer 140B is located between the second pixel unit 130B and the third pixel unit 130C. The first functional layer 131 of the second pixel unit 130B is bonded to the second functional layer 133 of the third pixel unit 130C through the second interlayer bonding layer 140B.

It may be understood that, in the present embodiment, the first functional layer 131 of the second pixel unit 130B and the second functional layer 133 of the third pixel unit 130C are bonded together through the second interlayer bonding layer 140B, the first functional layer 131 of the second pixel unit 130B, the second interlayer bonding layer 140B, and the first functional layer 131 of the third pixel unit 130C are connected to each other to form a second common electrode. The second common electrode is electrically connected to the driving substrate 11 by the connection electrode 16, and the design of the connection electrode 16 in the related art is reduced, to prevent the design of excessive connection electrodes 16 from occupying a light-emitting area of a light-emitting layer in the pixel unit 130, so that a light-emitting area of the pixel unit group 13 can be increased and light-emitting efficiency can be improved.

It should be noted that, in the present embodiment, in a direction of the driving substrate 11 pointing to the pixel unit group 13, a width of the first pixel unit 130A, a width of the second pixel unit 130B, and a width of the third pixel unit 130C sequentially decrease, so that the pixel unit group 13 is an inverted taper structure. The inverted taper may be naturally formed upward from the bottom during etching and patterning of the layers in the pixel unit group 13. Specifically, in the present embodiment, deposition, bonding, and substrate stripping may be repetitively performed on the light-emitting layer on the driving substrate to form the pixel unit group 13, so that high precision alignment is not required, and the difficulty of a bonding process is reduced.

In addition, the light-emitting color of the first light-emitting layer 130A1 includes, but not limited to, one of red, green, and blue, the light-emitting color of the second light-emitting layer 130B1 includes, but not limited to, one of red, green, and blue, and the light-emitting color of the third light-emitting layer 130C1 includes, but not limited to, one of red, green, and blue. In the present embodiment, the technical solution of the present disclosure is described by using an example in which the light-emitting color of the first light-emitting layer 130A1 is red, the light-emitting color of the second light-emitting layer 130B1 is green, and the light-emitting color of the third light-emitting layer 130C1 is blue.

Furthermore, in some embodiments, each of a shape of the first pixel unit 130A, a shape of the second pixel unit 130B, and a shape of the third pixel unit 130C includes, but not limited to, one of a rectangle, a square, a triangle, a trapezoid, or a polygon. In the present embodiment, the technical solution of the present disclosure is described by using an example in which the shape of the first pixel unit 130A, the shape of the second pixel unit 130B, and the shape of the third pixel unit 130C are rectangles.

Further, in the present embodiment, the second interlayer bonding layer 140B includes a second bonding main body portion 140B1 and a second extension portion 140B2. The second extension portion 140B2 extends in a second direction X2 from an end of the second bonding main body portion 140B1. The second pixel unit 130B and the third pixel unit 130C are bonded to each other through the second bonding main body portion 140B1. An orthogonal projection of the second extension portion 140B2 onto the driving substrate 11 is located the orthogonal projection of the second pixel unit 130B onto the driving substrate 11, and the orthogonal projection of the second extension portion 140B2 onto the driving substrate 11 and an orthogonal projection of the third pixel unit 130C onto the driving substrate 11 do not overlap, to ensure the effective light-emitting area of the third pixel unit 130C. The first direction X1 and the second direction X2 are parallel and opposite.

Specifically, the boss 13A includes a first side wall 13A1 and a second side wall 13A2 that are disposed oppositely, the first side wall 13A1 is located on a side of the first extension portion 140A2 away from the first bonding main body portion 140A1, and the second side wall 13A2 is located on a side of the second extension portion 140B2 away from the second bonding main body portion 140B1. The connection electrode 16 includes a first connection electrode 16A and a second connection electrode 16B, the first connection electrode 16A is located on the first side wall 13A1 of the boss 13A, the first connection electrode 16A and the first side wall 13A1 are disposed insulatively from each other, the second connection electrode 16B is located on the second side wall 13A2 of the boss 13A, and the second connection electrode 16B and the second side wall 13A2 are disposed insulatively from each other.

The bottom bonding layer 12 is electrically connected to a first contact 1 of the driving substrate 11; an end of the first connection electrode 16A is connected to the first extension portion 140A2, and another end of the first connection electrode 16A is electrically connected to a second contact 2 of the driving substrate 11; and an end of the second connection electrode 16B is connected to the second extension portion 140B2, and another end of the second connection electrode 16B is electrically connected to a third contact 3 of the driving substrate 11.

In the present embodiment, the third pixel unit 130C includes a top electrode 15, and the top electrode 15 is located on a side of the third pixel unit 130C away from the driving substrate 11. The boss 13A includes a third side wall 13A3 connecting the first side wall 13A1 and the second side wall 13A2. The connection electrode 16 includes a third connection electrode 16C, the third connection electrode 16C is located on the third side wall 13A3 of the boss 13A, and the third connection electrode 16C and the third side wall 13A3 are disposed insulatively from each other. An end of the third connection electrode 16C is connected to the top electrode 15 of the third pixel unit 130C, and another end of the third connection electrode 16C is electrically connected to a fourth contact 4 of the driving substrate 11.

Preferably, in the present embodiment, orthogonal projections of the first contact 1, the second contact 2, the third contact 3, and the fourth contact 4 onto the driving substrate 11 do not overlap. The first contact 1 and the third contact 3 of the driving substrate 11 are P electrode contacts of the pixel driver, and the second contact 2 and the fourth contact 4 of the driving substrate 11 are N electrode contacts of the pixel driver.

Specifically, the first connection electrode 16A includes a first connection subportion 16A1 located on the first extension portion 140A2. An orthogonal projection of the first connection subportion 16A1 onto the driving substrate 11 at least overlaps a part of the orthogonal projection of the first extension portion 140A2 onto the driving substrate 11, and the orthogonal projection of the first connection subportion 16A1 onto the driving substrate 11 and an orthogonal projection of the first bonding main body portion 140A1 onto the driving substrate 11 do not overlap each other, to ensure the effective light-emitting area of the second pixel unit 130B.

The second connection electrode 16B includes a second connection subportion 16B1 located on the second extension portion 140B2. An orthogonal projection of the second connection subportion 16B1 onto the driving substrate 11 at least overlaps a part of the orthogonal projection of the second extension portion 140B2 onto the driving substrate 11, and the orthogonal projection of the second connection subportion 16B1 onto the driving substrate 11 and an orthogonal projection the second bonding main body portion 140B1 onto the driving substrate 11 do not overlap each other, to ensure the effective light-emitting area of the third pixel unit 130C.

The third connection electrode 16C includes a third connection subportion 16C1 located on a top electrode layer 15, and an orthogonal projection of the third connection subportion 16C1 onto the driving substrate 11 at least overlaps a part of an orthogonal projection of the top electrode layer 15 onto the driving substrate 11.

It may be understood that, in the present embodiment, the first functional layer 131 of the first pixel unit 130A is electrically connected to the first contact 1 of the driving substrate 11 by the bottom bonding layer 12, the second functional layer 133 of the first pixel unit 130A is electrically connected to the second contact 2 of the driving substrate 11 by the first interlayer bonding layer 140A, the first common electrode is electrically connected, by the first connection electrode 16A, to the second contact 2 electrically connected to the driving substrate 11, the second common electrode is electrically connected, by the second connection electrode 16B, to the third contact 3 electrically connected to the driving substrate 11, and the first functional layer 131 of the third pixel unit 130C is electrically connected to the fourth contact 4 of the driving substrate 11 by the top electrode 15, so that the pixel driver separately controls operation of the first pixel unit 130A, the second pixel unit 130B, and the third pixel unit 130C, that is, the first pixel unit 130A, the second pixel unit 130B, and the third pixel unit 130C can separately emit light. For example, in a frame, when colors corresponding to two or more light-emitting layers 132 need to be displayed, a time t of the frame may be divided into different time periods. A pixel unit 130 (one of the first pixel unit 130A, the second pixel unit 130B, and the third pixel unit 130C) of one color is separately driven in each time period to emit required luminance. Specifically, red is displayed in ⅓t, blue is displayed in ⅓t, and green is displayed in ⅓t. In combination with the persistence of vision of human eyes, the three colors may be combined into one color, to implement time-division driven full-color display.

Further, in the present embodiment, a material of the bottom bonding layer 12 includes, but not limited to, a reflective conductive material; and/or a material of the interlayer bonding layer 14 includes, but not limited to, a transparent conductive material; and/or a material of the top electrode 15 includes, but not limited to, a transparent conductive material.

When the material of the bottom bonding layer 12 is preferably a reflective conductive material, the material of the bottom bonding layer 12 includes, but not limited to, a metal material such as silver (Ag), aluminum (Al), gold (Au), tin (Su), copper (CU), and the like. When the material of the interlayer bonding layer 14 and the material of the top electrode 15 are both preferably transparent conductive materials, the transparent conductive material includes, but not limited to, one of indium zinc oxide (IZO), indium tin oxide (ITO), poly(3,4-ethylenedioxythiophene) polystyrene sulfonate (PEDOT), and graphene. It may be understood that, the material of the bottom bonding layer 12 is a reflective conductive material, and the material of the interlayer bonding layer 14 and the material of the top electrode 15 are both transparent conductive materials, the light-emitting luminance of the first light-emitting layer 130A1, the second light-emitting layer 130B1, and the third light-emitting layer 130C1 can be increased.

It should be noted that, in another embodiment, the material of the bottom bonding layer 12, the material of the interlayer bonding layer 14, and the material of the top electrode 15 are all reflective transparent materials. Specifically, the bottom bonding layer 12 is configured to reflect light having a first wavelength, the first interlayer bonding layer 140A is configured to reflect light having a second wavelength, and the second interlayer bonding layer 140B is configured to reflect light having a third wavelength. The light having the first wavelength includes light emitted by the first light-emitting layer 130A1, the light having the second wavelength includes light emitted by the second light-emitting layer 130B1, and the light having the third wavelength includes light emitted by the third light-emitting layer 130C1, so that green light emitted by the second light-emitting layer 130B1 can be inhibited from causing optical crosstalk to a material of the first pixel unit 130A, and in addition blue light emitted by the third light-emitting layer 130C1 can be inhibited from causing optical crosstalk to a material of the second pixel unit 130B, thereby improving the overall contrast of the pixel unit group 13.

It may be understood that, in another embodiment, the display panel 10 further includes a first reflection layer, a second reflection layer, and a third reflection layer, the first reflection layer is located between the first light-emitting layer 130A1 and the bottom bonding layer 12, the second reflection layer is located between the second light-emitting layer 130B1 and the first interlayer bonding layer 140A, and the third reflection layer is located between the third light-emitting layer 130C1 and the second interlayer bonding layer 140B. In this case, the material of the interlayer bonding layer 14 and the material of the top electrode 15 are both transparent conductive materials.

Further, the first reflection layer is configured to reflect the light having the first wavelength, the second reflection layer is configured to reflect the light having the second wavelength, and the third reflection layer is configured to reflect the light having the third wavelength. The light having the first wavelength corresponds to the light emitted by the first light-emitting layer 130A1, the light having the second wavelength corresponds to the light emitted by the second light-emitting layer 130B1, and the light having the third wavelength corresponds to the light emitted by the third light-emitting layer 130C1. The first light-emitting layer emits red light with a wavelength of 580 nanometers to 680 nanometers, the second light-emitting layer emits green light with a wavelength of 480 nanometers to 580 nanometers, and the third light-emitting layer emits blue light with a wavelength of 430 nanometers to 480 nanometers.

Specifically, the light having the first wavelength includes light emitted by the first light-emitting layer, the light having the second wavelength includes light emitted by the second light-emitting layer, and the light having the third wavelength includes light emitted by the third light-emitting layer, so that green light emitted by the second light-emitting layer 130B1 can be inhibited from causing optical crosstalk to a material of the first pixel unit 130A, and in addition blue light emitted by the third light-emitting layer 130C1 can be inhibited from causing optical crosstalk to a material of the second pixel unit 130B, thereby improving the overall contrast of the pixel unit group 13.

In the display panel provided in the present embodiment, the display device includes a terminal main body and the display panel in any foregoing embodiment, and the terminal main body and the display panel are integrated.

It may be understood that the display panel has been described in the foregoing embodiment in detail. Details are not described herein again.

During specific application, the display device may be a display screen of a device such as a smartphone, a tablet computer, a notebook computer, a smart band, a smartwatch, smart glasses, a smart helmet, a desktop computer, a smart television, a digital camera, or the like, or even may be applied to an electronic device with a flexible display screen.

In summary, although the present disclosure has been disclosed above with reference to preferred embodiments, the foregoing preferred embodiments are not used to limit the present invention. A person of ordinary skill in the art may make various variations and modifications without departing from the spirit and scope of the present invention. Therefore, the scope of protection of the present disclosure shall be defined by the claims.

What is claimed is:

1. A display panel, comprising:

a driving substrate;

a pixel unit group, disposed on a side of the driving substrate, wherein the pixel unit group comprises a plurality of pixel units that are stacked, and each pixel unit comprises a first functional layer, a light-emitting layer, and a second functional layer that are stacked;

a bottom bonding layer, wherein the pixel unit that is in the pixel unit group and is close to the driving substrate is bonded to the driving substrate through the bottom bonding layer; and at least one interlayer bonding layer, wherein adjacent two of the pixel units are bonded to each other through the interlayer bonding layer, wherein the first functional layers of adjacent two of the pixel units are adjacent, and each interlayer bonding layer is located between adjacent two of the first functional layers, or, second functional layers of adjacent two of the pixel units are adjacent, and each interlayer bonding layer is located between adjacent two of the second functional layers.

2. The display panel as claimed in claim 1, wherein a connection electrode is disposed at an edge of each interlayer bonding layer, and two of the first functional layers or two of the second functional layers adjacent to each interlayer bonding layer are electrically connected to the driving substrate by a same connection electrode.

3. The display panel as claimed in claim 2, wherein a boss is formed at the pixel unit group, and in a direction of the driving substrate pointing to the pixel unit group, in adjacent two of the pixel units, a width of the pixel unit disposed close to the driving substrate is greater than a width of the pixel unit disposed away from the driving substrate.

4. The display panel as claimed in claim 3, wherein the pixel unit group comprises a first pixel unit and a second pixel unit, the second pixel unit is located on a side of the first pixel unit away from the driving substrate, the first pixel unit comprises a first light-emitting layer, the second pixel unit comprises a second light-emitting layer, and a light-emitting color of the first light-emitting layer is different from a light-emitting color of the second light-emitting layer; and the interlayer bonding layer comprises a first interlayer bonding layer, the first interlayer bonding layer is located between the first pixel unit and the second pixel unit, the first interlayer bonding layer comprises a first bonding main body portion and a first extension portion, and the first extension portion extends in a first direction from an end of the first bonding main body portion, wherein the first pixel unit and the second pixel unit are bonded to each other through the first bonding main body portion, an orthogonal projection of the first extension portion onto the driving substrate is located in an orthogonal projection of the first pixel unit onto the driving substrate, and the orthogonal projection of the first extension portion onto the driving substrate and an orthogonal projection of the second pixel unit onto the driving substrate do not overlap.

5. The display panel as claimed in claim 4, wherein the pixel unit group further comprises a third pixel unit, the third pixel unit is located on a side of the second pixel unit away from the first pixel unit, the third pixel unit comprises a third light-emitting layer, and the light-emitting color of the first light-emitting layer, the light-emitting color of the second light-emitting layer, and a light-emitting color of the third light-emitting layer are different; and the interlayer bonding layer comprises a second interlayer bonding layer, the second interlayer bonding layer comprises a second bonding main body portion and a second extension portion, and the second extension portion extends in a second direction from an end of the second bonding main body portion, wherein the second pixel unit and the third pixel unit are bonded to each other through the second bonding main body portion, an orthogonal projection of the second extension portion onto the driving substrate is located in the orthogonal projection of the second pixel unit onto the driving substrate, and the orthogonal projection of the second extension portion onto the driving substrate and an orthogonal projection of the third pixel unit onto the driving substrate do not overlap.

6. The display panel as claimed in claim 5, wherein the boss comprises a first side wall and a second side wall that are disposed oppositely, the first side wall is located on a side of the first extension portion away from the first bonding main body portion, and the second side wall is located on a side of the second extension portion away from the second bonding main body portion; and the connection electrode comprises a first connection electrode and a second connection electrode, the first connection electrode is located on the first side wall of the boss, the first connection electrode and the first side wall are disposed insulatively from each other, the second connection electrode is located on the second side wall of the boss, and the second connection electrode and the second side wall are disposed insulatively from each other, wherein the bottom bonding layer is electrically connected to a first contact of the driving substrate; an end of the first connection electrode is connected to the first extension portion, and another end of the first connection electrode is electrically connected to a second contact of the driving substrate; and an end of the second connection electrode is connected to the second extension portion, and another end of the second connection electrode is electrically connected to a third contact of the driving substrate.

7. The display panel as claimed in claim 6, wherein the third pixel unit comprises a top electrode, and the top electrode is located on a side of the third pixel unit away from the driving substrate;

the boss comprises a third side wall connecting the first side wall and the second side wall; and the connection electrode comprises a third connection electrode, the third connection electrode is located on the third side wall of the boss, and the third connection electrode and the third side wall are disposed insulatively from each other, wherein an end of the third connection electrode is connected to the top electrode of the third pixel unit, and another end of the third connection electrode is electrically connected to a fourth contact of the driving substrate.

8. The display panel as claimed in claim 7, wherein orthogonal projections of the first contact, the second contact, the third contact, and the fourth contact onto the driving substrate do not overlap.

9. The display panel as claimed in claim 5, wherein the display panel further comprises a first reflection layer, a second reflection layer, and a third reflection layer, the first reflection layer is located between the first light-emitting layer and the bottom bonding layer, the second reflection layer is located between the second light-emitting layer and the first interlayer bonding layer, and the third reflection layer is located between the third light-emitting layer and the second interlayer bonding layer.

10. The display panel as claimed in claim 9, wherein the first reflection layer is configured to reflect light having a first wavelength, the second reflection layer is configured to reflect light having a second wavelength, and the third reflection layer is configured to reflect light having a third wavelength, wherein the light having the first wavelength comprises light emitted by the first light-emitting layer, the light having the second wavelength comprises light emitted by the second light-emitting layer, and the light having the third wavelength comprises light emitted by the third light-emitting layer.

11. The display panel as claimed in claim 1, wherein a material of the bottom bonding layer is a reflective conductive material; and/or a material of the interlayer bonding layer is a transparent conductive material.

12. The display panel as claimed in claim 1, wherein the first functional layer is one of a p-type doped layer and an n-type doped layer, and the second functional layer is the other one of the p-type doped layer and the n-type doped layer.

13. A display device, wherein the display device comprises a terminal main body and a display panel, the terminal main body and the display panel are integrated, and the display panel comprises:

a driving substrate;

a pixel unit group, disposed on a side of the driving substrate, wherein the pixel unit group comprises a plurality of pixel units that are stacked, and each pixel unit comprises a first functional layer, a light-emitting layer, and a second functional layer that are stacked;

a bottom bonding layer, wherein the pixel unit that is in the pixel unit group and is close to the driving substrate is bonded to the driving substrate through the bottom bonding layer; and at least one interlayer bonding layer, wherein adjacent two of the pixel units are bonded to each other through one interlayer bonding layer, wherein the first functional layers of adjacent two of the pixel units are adjacent, and each interlayer bonding layer is located between adjacent two of the first functional layers, or, second functional layers of adjacent two of the pixel units are adjacent, and each interlayer bonding layer is located between adjacent two of the second functional layers.

14. The display device as claimed in claim 13, wherein a connection electrode is disposed at an edge of each interlayer bonding layer, and two of the first functional layers or two of the second functional layers adjacent to each interlayer bonding layer are electrically connected to the driving substrate by a same connection electrode.

15. The display device as claimed in claim 14, wherein a boss is formed at the pixel unit group, and in a direction of the driving substrate pointing to the pixel unit group, in adjacent two of the pixel units, a width of the pixel unit disposed close to the driving substrate is greater than a width of the pixel unit disposed away from the driving substrate.

16. The display device as claimed in claim 15, wherein the pixel unit group comprises a first pixel unit and a second pixel unit, the second pixel unit is located on a side of the first pixel unit away from the driving substrate, the first pixel unit comprises a first light-emitting layer, the second pixel unit comprises a second light-emitting layer, and a light-emitting color of the first light-emitting layer is different from a light-emitting color of the second light-emitting layer; and the interlayer bonding layer comprises a first interlayer bonding layer, the first interlayer bonding layer is located between the first pixel unit and the second pixel unit, the first interlayer bonding layer comprises a first bonding main body portion and a first extension portion, and the first extension portion extends in a first direction from an end of the first bonding main body portion, wherein the first pixel unit and the second pixel unit are bonded to each other through the first bonding main body portion, an orthogonal projection of the first extension portion onto the driving substrate is located in an orthogonal projection of the first pixel unit onto the driving substrate, and the orthogonal projection of the first extension portion onto the driving substrate and an orthogonal projection of the second pixel unit onto the driving substrate do not overlap.

17. The display device as claimed in claim 16, wherein the pixel unit group further comprises a third pixel unit, the third pixel unit is located on a side of the second pixel unit away from the first pixel unit, the third pixel unit comprises a third light-emitting layer, and the light-emitting color of the first light-emitting layer, the light-emitting color of the second light-emitting layer, and a light-emitting color of the third light-emitting layer are different; and the interlayer bonding layer comprises a second interlayer bonding layer, the second interlayer bonding layer comprises a second bonding main body portion and a second extension portion, and the second extension portion extends in a second direction from an end of the second bonding main body portion, wherein the second pixel unit and the third pixel unit are bonded to each other through the second bonding main body portion, an orthogonal projection of the second extension portion onto the driving substrate is located in the orthogonal projection of the second pixel unit onto the driving substrate, and the orthogonal projection of the second extension portion onto the driving substrate and an orthogonal projection of the third pixel unit onto the driving substrate do not overlap.

18. The display device as claimed in claim 17, wherein the boss comprises a first side wall and a second side wall that are disposed oppositely, the first side wall is located on a side of the first extension portion away from the first bonding main body portion, and the second side wall is located on a side of the second extension portion away from the second bonding main body portion; and the connection electrode comprises a first connection electrode and a second connection electrode, the first connection electrode is located on the first side wall of the boss, the first connection electrode and the first side wall are disposed insulatively from each other, the second connection electrode is located on the second side wall of the boss, and the second connection electrode and the second side wall are disposed insulatively from each other, wherein the bottom bonding layer is electrically connected to a first contact of the driving substrate; an end of the first connection electrode is connected to the first extension portion, and another end of the first connection electrode is electrically connected to a second contact of the driving substrate; and an end of the second connection electrode is connected to the second extension portion, and another end of the second connection electrode is electrically connected to a third contact of the driving substrate.

19. The display device as claimed in claim 18, wherein the third pixel unit comprises a top electrode, and the top electrode is located on a side of the third pixel unit away from the driving substrate;

the boss comprises a third side wall connecting the first side wall and the second side wall; and the connection electrode comprises a third connection electrode, the third connection electrode is located on the third side wall of the boss, and the third connection electrode and the third side wall are disposed insulatively from each other, wherein an end of the third connection electrode is connected to the top electrode of the third pixel unit, and another end of the third connection electrode is electrically connected to a fourth contact of the driving substrate.

20. The display device as claimed in claim 19, wherein orthogonal projections of the first contact, the second contact, the third contact, and the fourth contact onto the driving substrate do not overlap.

* * * * *